(12) United States Patent
Lee et al.

(10) Patent No.: US 10,276,397 B2
(45) Date of Patent: Apr. 30, 2019

(54) CVD METAL SEED LAYER

(71) Applicant: Taiwan Semiconductor Manufacturing Co., Ltd., Hsin-Chu (TW)

(72) Inventors: Ya-Ling Lee, Hsinchu (TW); Lin-Jung Wu, Miaoli (TW); Victor Y. Lu, Foster City, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 529 days.

(21) Appl. No.: 14/803,445

(22) Filed: Jul. 20, 2015

(65) Prior Publication Data
US 2017/0005038 A1 Jan. 5, 2017

Related U.S. Application Data

(60) Provisional application No. 62/186,583, filed on Jun. 30, 2015.

(51) Int. Cl.
| | |
|---|---|
| *H01L 21/311* | (2006.01) |
| *H01L 21/288* | (2006.01) |
| *H01L 21/768* | (2006.01) |
| *H01L 21/285* | (2006.01) |
| *H01L 23/532* | (2006.01) |

(52) U.S. Cl.
CPC .... *H01L 21/31111* (2013.01); *H01L 21/2885* (2013.01); *H01L 21/28556* (2013.01);
(Continued)

(58) Field of Classification Search
CPC ............ H01L 21/3111; H01L 21/2885; H01L 23/5329; H01L 21/76801–21/76814;
(Continued)

(56) References Cited

U.S. PATENT DOCUMENTS

| | | | |
|---|---|---|---|
| 9,472,502 B1* | 10/2016 | Lee | H01L 21/28518 |
| 2001/0005056 A1* | 6/2001 | Cohen | H01L 21/76843 257/751 |

(Continued)

OTHER PUBLICATIONS

Tompkins, et al. "The Oxidation of Cobalt in Air From Room Temperature to 467 Degrees C." Oxidation of Metals, vol. 16, Nos. 5/6, (1981).

(Continued)

*Primary Examiner* — Cuong B Nguyen
(74) *Attorney, Agent, or Firm* — Eschweiler & Potashnik, LLC

(57) ABSTRACT

The present disclosure relates to an improved method of forming interconnection layers to reduce voids and improve reliability, and an associated device. In some embodiments, a dielectric layer is formed over a semiconductor substrate having an opening arranged within the dielectric layer. A metal seed layer is formed on the surfaces of the opening using a chemical vapor deposition (CVD) process. Then a metal layer is plated onto the metal seed layer to fill the opening. Forming the metal seed layer using a CVD process provides the seed layer with a good uniformity, which allows for high aspect ratio openings in the dielectric layer to be filled without voids or pinch off.

20 Claims, 5 Drawing Sheets

(52) U.S. Cl.
CPC .. *H01L 21/28568* (2013.01); *H01L 21/76802* (2013.01); *H01L 21/76856* (2013.01); *H01L 21/76873* (2013.01); *H01L 21/76879* (2013.01); *H01L 23/5329* (2013.01); *H01L 23/53238* (2013.01); *H01L 23/53266* (2013.01); *H01L 21/76843* (2013.01); *H01L 2221/1063* (2013.01)

(58) Field of Classification Search
CPC .... H01L 45/1683; H01L 2221/10–2221/1089; H01L 2224/05006–2224/05093; H01L 2224/05546; H01L 21/02063; H01L 21/486; H01L 23/481–23/4855; H01L 23/5226; H01L 23/5384; H01L 2225/06541–2225/06548; H01L 21/76877–21/76898; H01L 23/49827
See application file for complete search history.

(56) References Cited

U.S. PATENT DOCUMENTS

| | | | |
|---|---|---|---|
| 2007/0148952 A1* | 6/2007 | O'Brien | B82Y 30/00 438/618 |
| 2010/0167529 A1* | 7/2010 | Sakata | H01L 21/2885 438/652 |
| 2012/0161320 A1 | 6/2012 | Akolkar et al. | |
| 2013/0186850 A1* | 7/2013 | Wang | C09K 3/1463 216/13 |
| 2014/0256127 A1* | 9/2014 | Spurlin | H01L 21/76873 438/643 |
| 2014/0256128 A1 | 9/2014 | Spurlin et al. | |
| 2014/0308794 A1 | 10/2014 | Lee et al. | |
| 2014/0374907 A1* | 12/2014 | Yu | H01L 21/76879 257/751 |
| 2015/0299886 A1* | 10/2015 | Doubina | C25D 5/34 205/157 |

OTHER PUBLICATIONS

Kim, et al. "Ultrathin CVD Cu Seed Layer Formation Using Copper Oxynitride Deposition and Room Temperature Remote Hydrogen Plasma Reduction." Journal of the Electrochemical Society, 155 (7) H496-H503 (2008).

Gordon, et al. "Trends in Copper Precursor Development for CVD and ALD Applications." ECS Journal of Solid State Science and Technology, 4 (1) N3188-N3197 (2015).

* cited by examiner

CVD METAL SEED LAYER

REFERENCE TO RELATED APPLICATION

This Application claims priority to U.S. Provisional Application No. 62/186,583 filed on Jun. 30, 2015, the contents of which are incorporated by reference in their entirety.

BACKGROUND

In the manufacturing of integrated circuits (ICs), devices are formed on a wafer and connected by conductive interconnection layers. These conductive interconnection layers are created by first forming openings (e.g. trenches and via holes in a dielectric layer) and then filling these openings with a conductive material.

In general, a conductive material is formed within the openings by an electrochemical plating process (ECP process). First, a seed layer is formed within the openings. Then the remaining spaces of the openings are filled with a conductive material. Finally, a planarization process is performed to remove excess material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
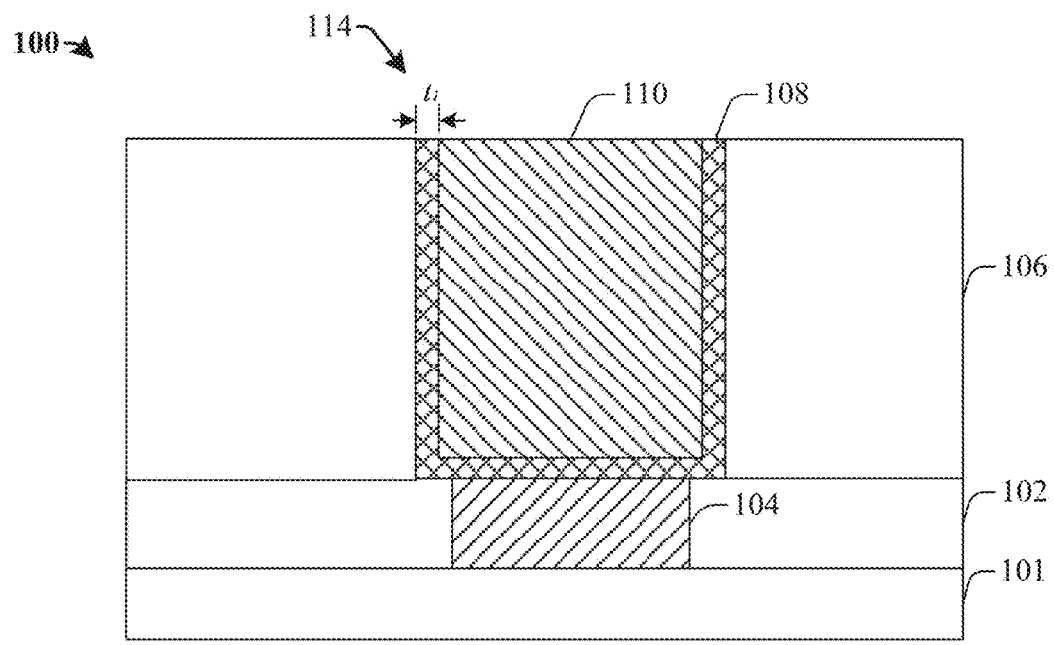
FIG. 1 shows a cross-sectional view of an integrated circuit having a metal seed layer in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conductive interconnection layers within an integrated circuit are typically formed using an electrochemical plating (ECP) process. The first step to form a conductive interconnection layer is to etch a surrounding dielectric material to form an opening (e.g., a trench or via hole). Then, a barrier layer configured to prevent metal atoms from diffusing into a neighboring low-k dielectric layer is formed within the opening. A copper seed layer is formed over the barrier layer, followed by filling the remaining space of the opening by plating a metal material on the copper seed layer. Then, a planarization step is performed. Currently, the copper seed layer is formed by a physical vapor deposition (PVD) process. However, it has been appreciated that a copper seed layer formed by a PVD process has poor step coverage because of its non-conformity. For example, a PVD deposition into an opening with vertical sidewalls results in the thickness of a deposited layer diminishing towards the base of the opening.

With the continued scaling of semiconductor devices, feature sizes of overlying conductive interconnect layers have also decreased. The decreased feature sizes of conductive interconnect layers have resulted in larger aspect ratios for the openings. The large aspect ratios of the openings make it difficult to appropriately fill the corresponding openings through conventional electrochemical plating (ECP) processes. For example, if a PVD process is used to form a relatively thick copper seed layer, pinch off may occur (e.g., the copper seed layer on sidewalls of the opening may connect above an underlying void or bubble in the copper) resulting in unfavorable electrical characteristics. On the other hand, if a PVD process is used to form a relatively thin copper seed layer a discontinuity in coverage of the copper seed layer may occur along a sidewall of the opening, resulting in the formation of voids or areas in which the conductive material is not formed. Since voids lack conductive material, they can result in bad connections and decrease reliability.

Accordingly, the present disclosure relates to an improved method of forming metal interconnection layers (e.g., metal lines and/or vias) to reduce voids and improve reliability, and an associated device. In some embodiments, the method comprises depositing a metal seed precursor (e.g. a cobalt layer) within an opening in a dielectric material using a chemical vapor deposition (CVD) process to improve uniformity. The metal seed precursor can be formed to have a relatively large thickness (e.g. greater than approximately 20 Å). A passivation film (e.g. a cobalt hydroxide film of about 10 Å) can be formed in an uppermost portion of the metal seed precursor by exposing the metal seed precursor to an ambient environment. This thin passivation film acts as a capping layer to prevent further oxidation or nitridation of the underlying metal seed precursor. An electrochemical plating process is then performed within a plating bath that removes the passivation layer, to fill the opening by forming a metal layer onto the metal seed precursor. By using a CVD process to form the metal seed precursor, the resulting metal interconnect layer fills the opening while avoiding pinch off and voids.

FIG. 1 shows a cross-sectional view of an integrated circuit 100 in accordance with some embodiments.

In some embodiments, the integrated circuit 100 comprises one or more conductive interconnection layers 104 disposed over a semiconductor substrate 101. The conductive interconnection layer 104 can be surrounded by a first inter-layer dielectric (ILD) layer 102. A dielectric layer 106 (e.g., a second ILD layer) is disposed over the conductive interconnection layer 104 and the first ILD layer 102. An opening 114 is disposed within the dielectric layer 106 and may extend downwardly through the dielectric layer 106. A metal seed layer 108 is disposed on bottom and sidewall surfaces of the opening 114. In some embodiments, the metal seed layer 108 is a conformal layer having outer surfaces abutting the dielectric layer 106. In some embodiments, the metal seed layer 108 may have a thickness t in a range of from about 10 Å to about 100 Å. In other embodiments, the metal seed layer 108 may have a thickness $t_1$ in a range of from about 20 Å to about 50 Å. In some embodiments, the metal seed layer 108 is a cobalt layer. In some other embodiments, the metal seed layer 108 may be a metal or alloy comprising one or more metal materials selected from a group of cobalt (Co), nickel (Ni), aluminum (Al), zinc (Zn), or platinum (Pt).

A metal layer 110 is disposed on the metal seed layer 108, filling remaining space of the opening 114. In some embodiments, the metal layer 110 can be a cobalt layer. In such embodiments, no barrier layer is present between the metal seed layer 108 and the dielectric layer 106. In some other embodiments, the metal layer 110 can be copper or a copper alloy (e.g., CuAl). In such embodiments, a barrier layer may be arranged between the copper or copper alloy and the dielectric layer 106.

Figure 2:
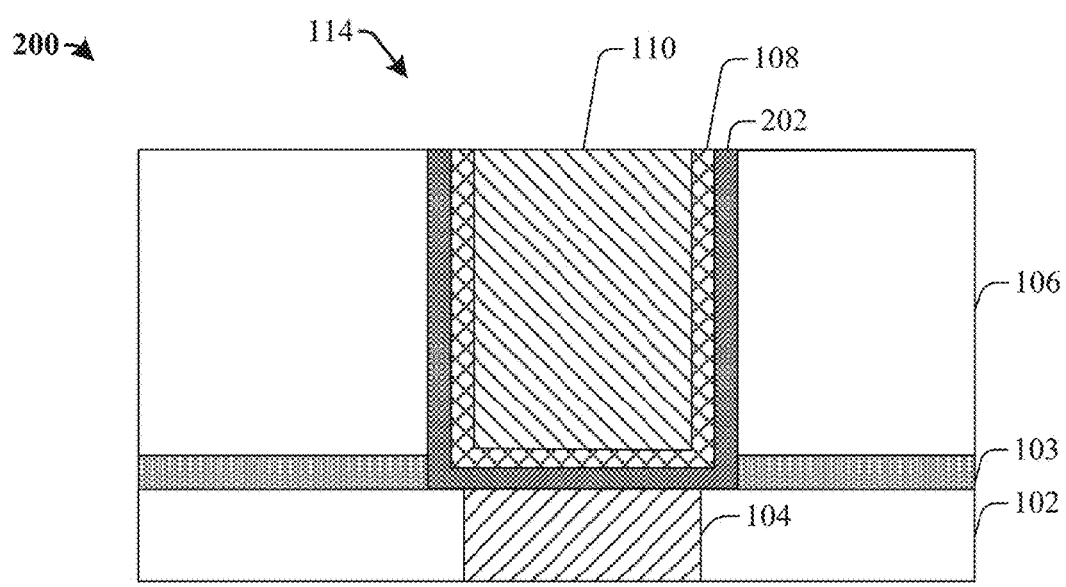
FIG. 2 shows a cross-sectional view of an integrated circuit having a metal seed layer in accordance with some other embodiments.

FIG. 2 shows a cross-sectional view of an integrated circuit 200 in accordance with some embodiments.

The integrated circuit 200 comprises a conductive interconnection layer 104 surrounded by a first ILD layer 102. In some embodiments, one or more additional conductive interconnection layers can be formed and connected either under or above the conductive interconnection layer 104. In some other embodiments, the conductive interconnection layer 104 can be directly connected to an active region of the integrated circuit 200. An etch stop layer 103 is arranged over the first ILD layer 102. A dielectric layer 106 is disposed over the etch stop layer 103. An opening 114 extends downwardly through the dielectric layer 106 and the etch stop layer 103, reaching the conductive interconnection layer 104.

In various embodiments, the dielectric layer 106 can be a silicon dioxide ($SiO_2$) layer (having a dielectric constant of approximately 3.9), a low-k dielectric layer (having a dielectric constant of less than 3.9), or an ultra low-k dielectric layer (having a dielectric constant of less than 2.2). In some other embodiments, the dielectric layer 106 can be silicon nitride or silicon oxynitride. The dielectric layer 106 can also be a porous or solid low-k dielectric having a dielectric constant of less than 3.9. In some embodiments, the etch stop layer 103 may comprise silicon carbide or silicon nitride.

In some embodiments, a metal seed layer 108 is conformally disposed along the sidewalls and lower surfaces of the opening 114. The metal seed layer 108 is uniformly disposed along the sidewall and lower surfaces of the opening 114 without discontinuity. A metal layer 110 is disposed on the metal seed layer 108 and fills remaining space of the opening 114. In some embodiments, the metal seed layer 108 can be made of cobalt and the metal layer 110 can be made of copper or an alloy comprising copper. The metal seed layer 108 and the metal layer 110 may have planar upper surfaces that are substantially aligned with an upper surface of the dielectric layer 106.

In some embodiments, the metal seed layer 108 may comprise a material that will form a passivation layer when exposed to an ambient environment comprising oxygen or nitrogen. In such embodiments, an upper most portion of the metal seed layer 108 is converted to passivation film when exposed to the ambient environment. For example, the metal seed layer 108 may comprise a metal having an upper surface that is converted to a passivation film comprising a metal oxide compound when exposed to the ambient environment. The passivation film can be formed quickly (in seconds) and then maintain a relatively stable thickness for a relatively long time (hours) to protect the remaining metal seed material under the passivation film from further oxidization or passivation.

In some embodiments, a barrier layer 202 can be disposed between the metal seed layer 108 and the dielectric layer 106. The barrier layer 202 comprises a thin liner covering sidewall surfaces of the opening 114. In some embodiments, the barrier layer 202 may extend along the sidewall and lower surfaces of the opening 114. The barrier layer 202 is configured to prevent migration of atoms from the metal layer 110 into the dielectric layer 106. In some embodiments, no such a barrier layer is present. In some embodiments, the barrier layer 202 can comprise tantalum nitride (TaN) or titanium nitride (TiN). In other embodiments, the barrier layer 202 can comprise other metals.

Figure 3:
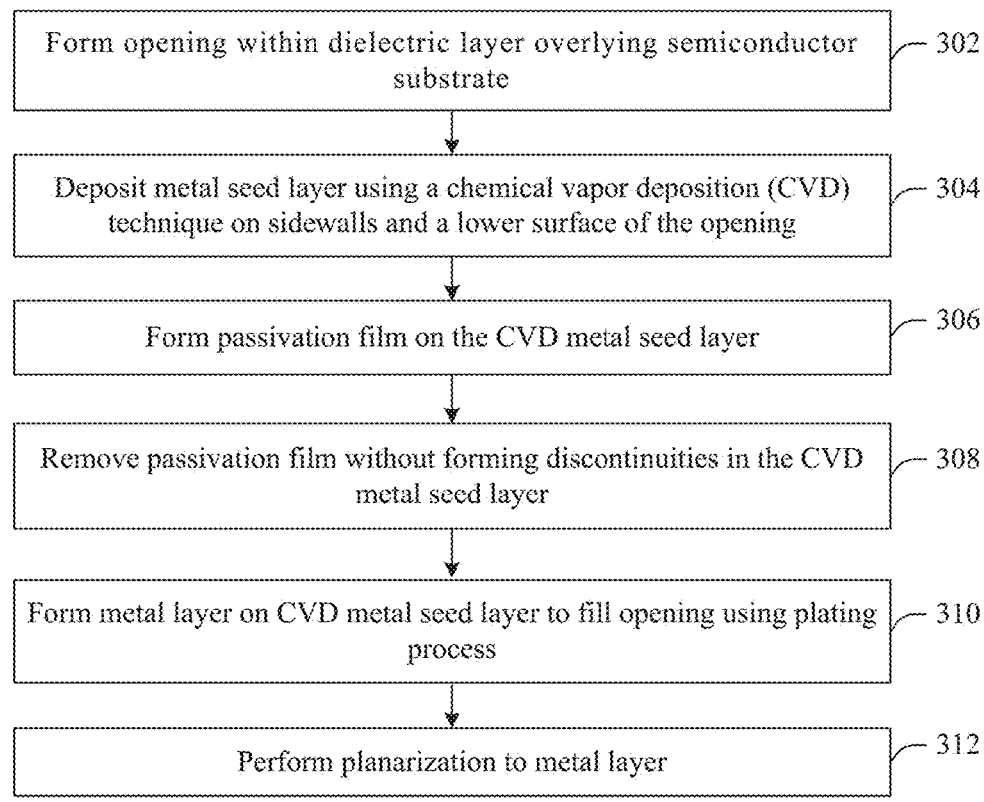
FIG. 3 shows a flow diagram of a method of filling an opening for interconnections in accordance with some embodiments.

FIG. 3 shows some embodiments of a flow diagram of a method 300 of filling an opening for interconnections in accordance with some embodiments. In some embodiments, the method 300 can be applied to an inter-metal layer of a back-end-of-the-line (BEOL) process or a mid-end-of-the-line (MEOL) process. While disclosed method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, an opening is formed within a dielectric layer overlying a semiconductor substrate.

At 304, a metal seed precursor is deposited on sidewalls and lower surfaces of the opening using a chemical vapor deposition (CVD) technique. In some embodiments, the metal seed precursor can be a cobalt layer and have a thickness greater than or equal to approximately 20 Å.

At 306, a passivation film is formed on the metal seed precursor. The passivation film can be formed by exposing the metal seed precursor to an ambient environment. In some embodiments, the metal seed precursor (e.g. cobalt layer) is exposed to air at room temperature and an uppermost portion of the metal seed precursor is oxidized to form the passivation film. The passivation film can be formed quickly (in seconds) and then be stable for a relatively long time (hours), so that oxidation to the lower portions of the metal seed precursor is minimized.

At 308, the passivation film is removed. In some embodiments, the passivation film is removed by a chemical solution that selectively removes the passivation film without removing the underlying metal seed precursor, so that the lower portion of the metal seed precursor is left to form a metal seed layer without discontinuity.

At 310, a metal layer is formed on the metal seed layer to fill the opening using a plating process. In various embodiments, the plating process may comprise an electro-chemical plating process or an electro-less plating process. In some embodiments, a chemical solution used to remove the passivation film is also used as a bath solution for the plating process. In various embodiments, the bath solution can be an acid bath, a base bath, or a neutral bath corresponding to different materials used for the metal seed precursor.

At 312, a planarization is performed to planarize the metal layer. In some embodiments, the planarization can be performed by a chemical-mechanical polishing (CMP_process.

FIGS. 4-8 show some cross-sectional views of a method of filling an opening for metal interconnections of an integrated chip according to some embodiments. Although FIGS. 4-8 are described in relation to method 300, it will be appreciated that the structures disclosed in FIGS. 4-8 are not limited to such a method 300, but instead may stand alone as structures independent of the method. Similarly, although the method is described in relation to FIGS. 4-8, it will be appreciated that the method is not limited to the structures disclosed in FIGS. 4-8, but instead may stand alone independent of the structures disclosed in FIGS. 4-8.

Figure 4:
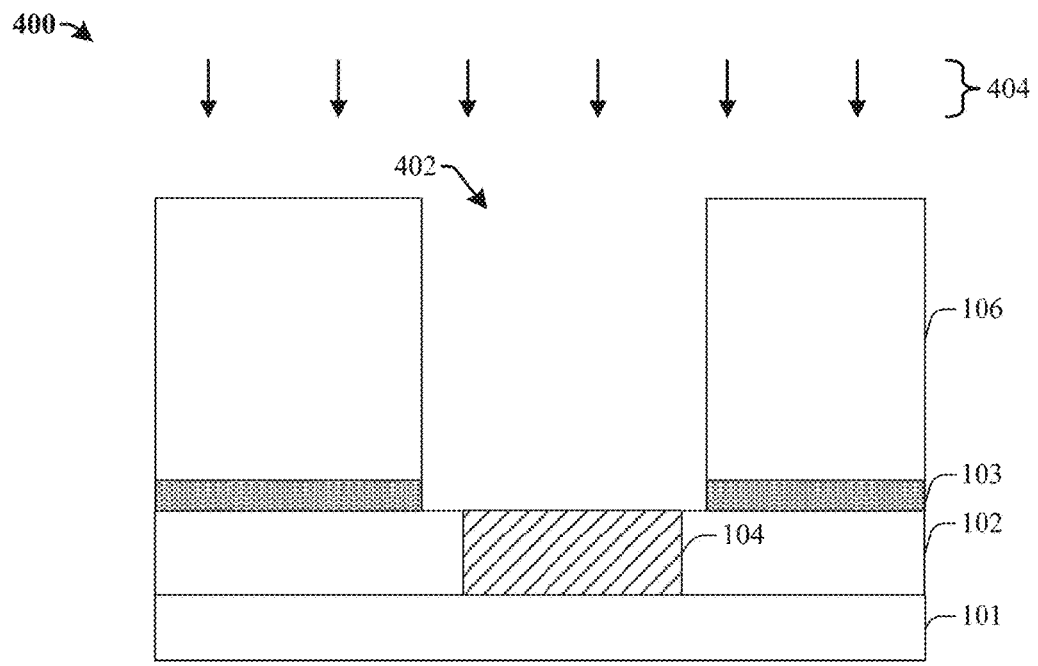
FIGS. 4-8 show cross-sectional views of an integrated circuit illustrating a method of filling an opening for interconnections in accordance with some embodiments.

FIG. 4 illustrates some embodiments of a cross-sectional view 400 corresponding to act 302.

As illustrated by cross-sectional view 400, a dielectric layer 106 is formed over a semiconductor substrate 101. In some embodiments, the dielectric layer 106 may be formed over a conductive interconnection layer 104 surrounded by a first ILD layer 102. The first ILD layer 102 can be made of same or different materials as the dielectric layer 106.

In some embodiments, the semiconductor substrate 101 can be a bulk silicon substrate or a semiconductor-on-insulator (SOI) substrate (e.g. silicon on insulator substrate). The semiconductor substrate 101 can also be a binary semiconductor substrate (e.g. GaAs), a tertiary semiconductor substrate (e.g. AlGaAs), or a higher order semiconductor substrate, for example. In some embodiments, the dielectric layer 106 can be a silicon dioxide ($SiO_2$) layer having a dielectric constant of approximately 3.9. In other embodiments, the dielectric layer 106 can be a porous or solid low-k dielectric with a dielectric constant of less than 3.9.

An opening 402 is formed within the dielectric layer 106. In some embodiments, the opening 402 is formed by subjecting the dielectric layer 106 to an etchant 404 configured to remove unmasked portions of the dielectric layer 106 according to a mask (not shown) previously formed over the dielectric layer 106. In various embodiments, the etchant 404 may comprise a dry etchant have an etching chemistry comprising a fluorine species (e.g., CF4, CHF3, C4F8, etc.). In other embodiments, the etchant 404 may comprise a wet etchant comprising hydroflouric acid (HF). The opening 402 vertically extends through the dielectric layer 106 to the underlying conductive interconnection layer 104. In some embodiments, the opening 402 may vertically extend through an etch stop layer 103 formed between the dielectric layer 106 and the first ILD layer 102. In some embodiments, the opening 402 may comprise trenches or via holes within which conductive interconnect layers are formed. In some embodiments, the opening 402 can be formed by a dual damascene process including forming a trench line overlying a via hole. The dual damascene process can be a trench first process, a via first process, or a self-aligned process. The opening 402 can also be a through substrate via opening.

Figure 5:
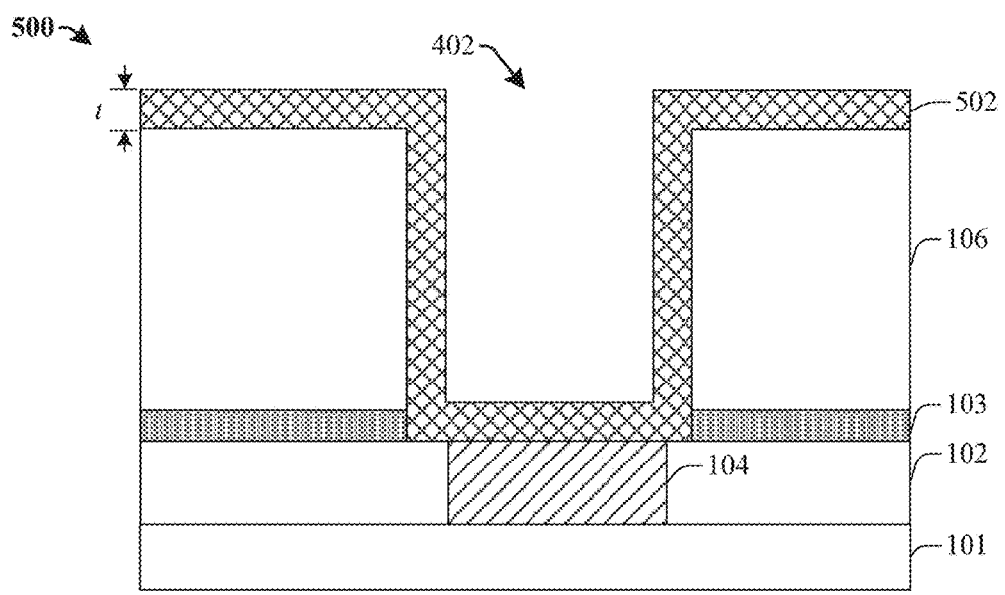

FIG. 5 illustrates some embodiments of a cross-sectional view 500 corresponding to act 304.

As illustrated by cross-sectional view 500, a metal seed precursor 502 is deposited on the sidewalls and lower surface of the opening 402 using a chemical vapor deposition (CVD) process. It will be appreciated that, as used herein, the term CVD may apply to any type of CVD process, including but not limited to plasma-enhanced CVD, remote plasma-enhanced CVD, atomic-layer CVD, rapid thermal CVD, aerosol assisted CVD, etc. In some embodiments, the metal seed precursor 502 extends outward from the opening 402 onto an upper surface of the dielectric layer 106. In some other embodiments, the metal seed precursor 502 is made of cobalt. In some other embodiments, the metal seed precursor 502 can comprise nickel (Ni), aluminum (Al), zirconium (Zn), or platinum (Pt). In some embodiments, the metal seed precursor 502 is deposited to a thickness t in a range of approximately 20 Å to approximately 100 Å. As an example, the metal seed precursor 502 can be a cobalt layer having a thickness greater than approximately 20 Å, more specifically in a range of about 50 Å to about 100 Å.

In some embodiments, a barrier layer (not shown) may be deposited along the sidewalls of the opening 402 prior to depositing the metal seed precursor 502, so that the barrier layer is formed between the metal seed layer 108 and the dielectric layer 106. The barrier layer is configured to protect copper from migrating into the dielectric layer 106. In various embodiments, the barrier layer can comprise tantalum nitride (TaN), titanium nitride (TiN), or other metals. Since cobalt and some other applicable metal materials have a better migration performance than copper, the barrier layer may not be present in some of the embodiments where copper is either not present or wherein copper is below certain proportions in the metal seed precursor 502.

Figure 6:
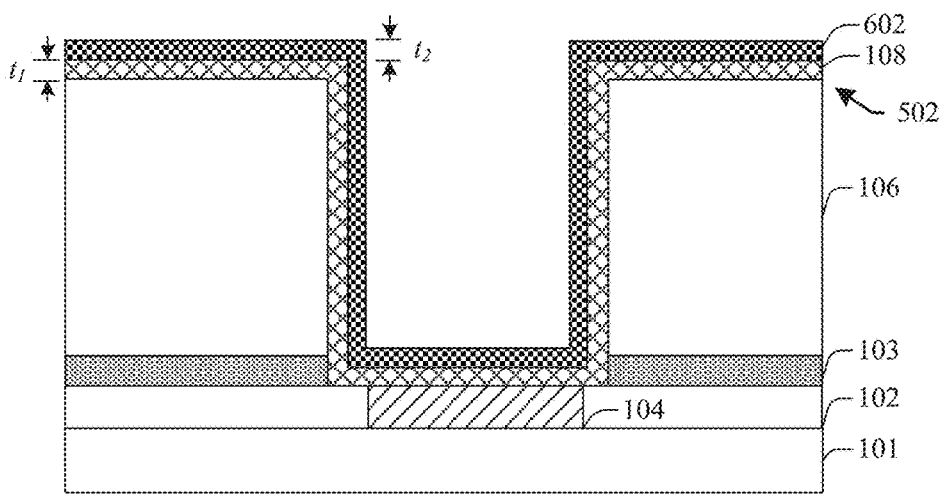

FIG. 6 illustrates some embodiments of a cross-sectional view 600 corresponding to act 306.

As illustrated by cross-sectional view 600, a passivation film 602 is formed onto the metal seed precursor 502. In some embodiments, the workpiece may be removed from a CVD chamber after the deposition of the metal seed precursor 502. Removing the workpiece from the CVD chamber exposes an upper surface of the metal seed precursor 502 to an ambient environment having a pressure greater than a pressure of the CVD chamber. The ambient environment causes the passivation film 602 to form within an upper surface of the metal seed precursor 502. The remaining lower portion of the metal seed precursor 502 is formed as a metal seed layer 108. In some embodiments, the ambient environment may comprise nitrogen ($N_2$) or oxygen ($O_2$) gas.

For example, the metal seed precursor 502 can be a cobalt layer. When the a cobalt layer is removed from a CVD chamber and exposed to air or oxygen at room temperature (298K=25° C.) the passivation film 602 is formed onto an exposed surface of the cobalt layer. The passivation film 602 comprises cobalt (II) hydroxide ($Co(OH)_2$) and may have a first thickness $t_1$ less than around 10 Å. The remaining metal seed layer 108 underneath the passivation film 602 has a second thickness $t_2$ greater than around 10 Å, thereby providing a sufficient seed layer thickness for a subsequent plating process. The $Co(OH)_2$ film is formed quickly (in seconds) to a fixed thickness range (around 10 Å) with a small amount of additional passivation penetrating deeper into the cobalt seed precursor over a relatively long time (hours). Thus, the cobalt seed precursor is self-passivated layer comprising an upper $Co(OH)_2$ passivation film formed onto a lower cobalt seed layer. In various embodiments, the conditions (e.g., temperature, pressure, etc.) for forming the passivation film 602 can be adjusted to achieve different thicknesses of the passivation film 602.

When other metal materials of nickel (Ni), aluminum (Al), zirconium (Zn), or platinum (Pt) are used for the metal seed precursor 502, similar self-passivated films may also be formed through exposure to an ambient environment. For example, at room temperature (298K=25° C.) and near (or below) atmospheric pressure (1 atm=760 torr), a native oxide layer having a thickness of approximately 50 Å for aluminum (Al) and in a range of between approximately 1 Å and approximately 3 Å for Pt can be formed. A corresponding thicker (e.g. 20 Å thicker than the formed native oxide layer) metal seed precursor can first be formed and protected by the self-passivated native oxide layer.

Figure 7:
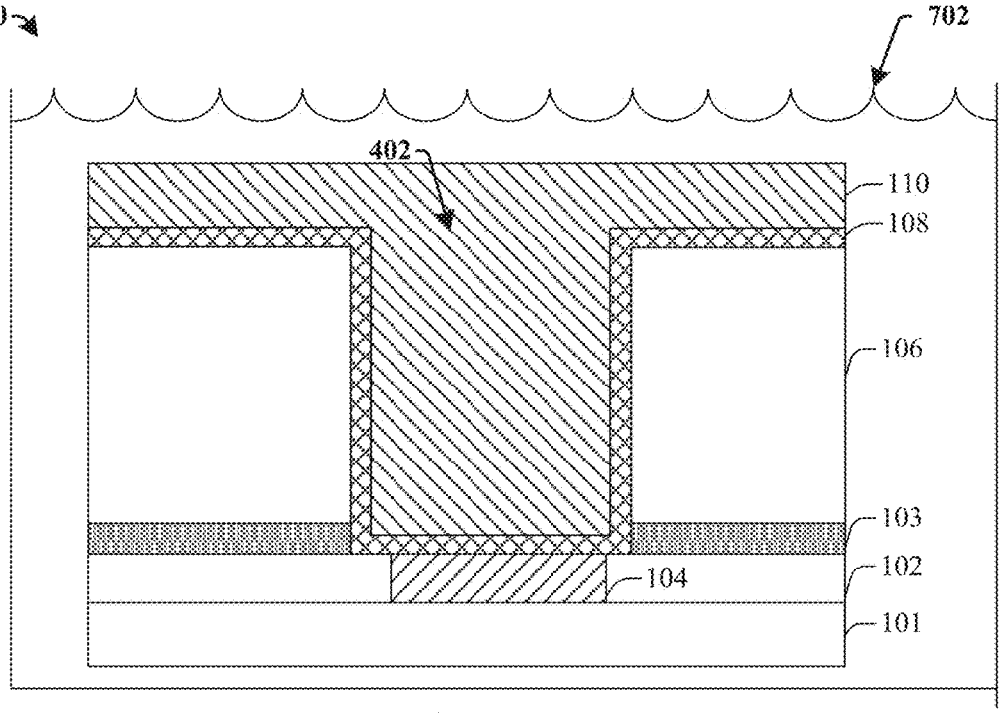

FIG. 7 illustrates some embodiments of a cross-sectional view 700 corresponding to act 308.

As illustrated by cross-sectional view 700, the passivation film 602 is removed and a metal layer 110 is formed onto the metal seed layer 108 by a plating process. The workpiece or at least an upper surface of the metal seed layer 108 is immersed in a bath solution 702 containing metal ions to be plated on the metal seed layer 108 to form the metal layer 110. The metal layer 110 is plated to the metal seed layer 108 to fill the remaining space of the opening 402. The metal layer 110 may extend over the opening 402 and overlie the dielectric layer 106. In some embodiments, the metal layer 110 can be made of cobalt or an alloy comprising cobalt. In some other embodiments, the metal layer 110 can comprise copper or an alloy comprising copper.

In some embodiments, the bath solution 702 is a chemical bath that dissolves the passivation film 602 without forming discontinuities in the metal seed layer 108. Therefore, after removing the passivation film 602, a uniform and continuing cobalt seed layer can be maintained. In some embodiments, wherein the metal seed layer 108 is made of cobalt, the bath solution 702 can be an acidic chemical bath having a pH level between approximately 0 and approximately 9. For example, the bath solution 702 can be a chemical bath comprising $H_3BO_3$ having a pH level around 4. In such embodiments, the Co(OH)2 film is dissolved into the bath solution 702 as $Co^{2+}$ ions, which can be re-deposited as part of the metal layer 110.

Figure 8:
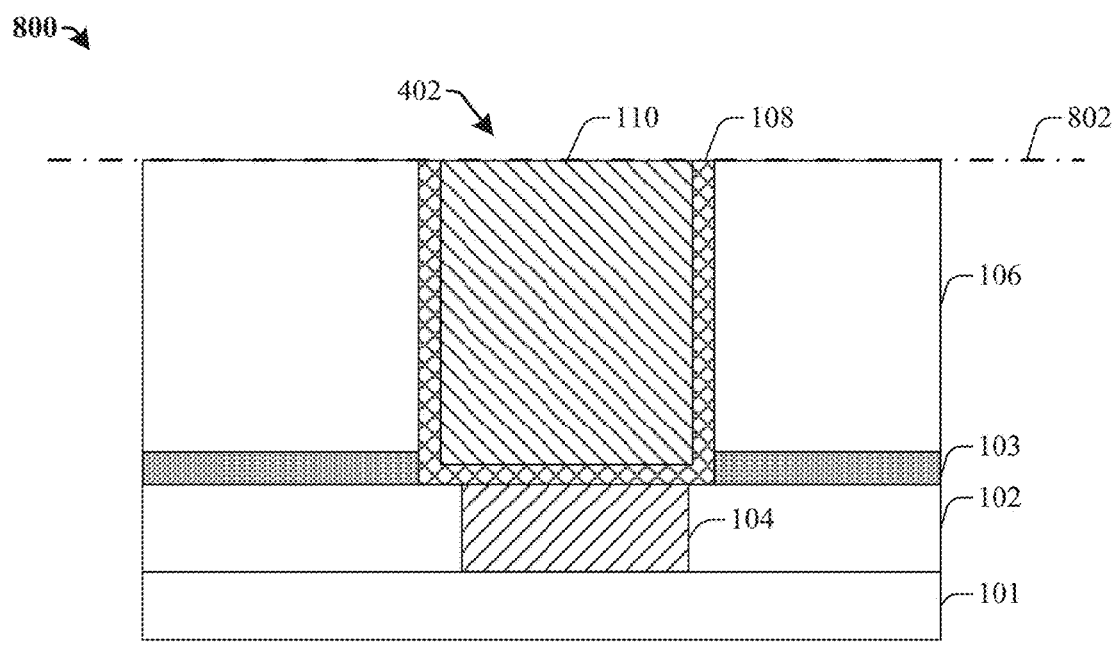

FIG. 8 illustrates some embodiments of a cross-sectional view 700 corresponding to act 310.

As illustrated by cross-sectional view 800, a planarization process is performed. The planarization process removes excessive portions of the metal layer 110, metal seed layer 108, and dielectric layer 106, to form a planar surface along line 802. As a result, the metal layer 110 and the metal seed layer 108 may have planar upper surfaces aligned with an upper surface of the dielectric layer 106. In some embodiments, the planarization process may comprise a chemical mechanical polishing (CMP) process. In other embodiments, the planarization process may comprise an etching process.

Thus, the present disclosure relates to optimized techniques to form interconnection layers that reduce voids and improve reliability. A metal seed precursor is formed within an opening using a chemical vapor deposition (CVD) process. The metal seed layer formed by CVD processes has a better uniformity than previous PVD seed layer, thus, better filling can be achieved.

In some embodiments, the present disclosure relates to a method of manufacturing an integrated circuit device. The method comprises forming a dielectric layer over a semiconductor substrate, wherein the dielectric layer comprises an opening being arranged within the dielectric layer. The method further comprises depositing a metal seed layer on surfaces of the opening using a chemical vapor deposition (CVD) process. The method further comprises electrochemically plating a metal layer onto the metal seed layer to fill the opening.

In other embodiments, the present disclosure relates to a method of manufacturing an integrated circuit device. The method comprises forming a dielectric layer over a semiconductor substrate, wherein the dielectric layer has an opening extending from an upper surface of the dielectric layer to a location within the dielectric layer. The method further comprises depositing a CVD cobalt seed layer on surfaces of the opening using a chemical vapor deposition (CVD) process. The method further comprises forming a cobalt layer on the metal seed layer using an electrochemical plating process to fill the opening.

In yet other embodiments, the present disclosure relates to an integrated circuit device. The integrated circuit device comprises a semiconductor substrate and a dielectric layer disposed over the semiconductor substrate and having an opening arranged within the dielectric layer. The integrated circuit device further comprises a metal seed layer disposed on surfaces of the opening. The integrated circuit device further comprises a metal layer filling a remaining portion of the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed:

1. A method of manufacturing an integrated circuit device, comprising:
forming a dielectric layer over a semiconductor substrate, wherein the dielectric layer comprises an opening being arranged within the dielectric layer;
depositing a metal seed precursor on surfaces of the opening using a chemical vapor deposition (CVD) process;
converting an uppermost portion of the metal seed precursor to form a capping layer and leaving a lower portion of the metal seed precursor to form a metal seed layer; and
using a plating bath to remove the capping layer and plate a metal layer onto the metal seed layer to fill the opening.

2. The method of claim 1, wherein the metal seed layer and the metal layer are made of cobalt (Co) and the metal seed layer is formed to abut the dielectric layer.

3. The method of claim 1, wherein metal seed layer comprises cobalt and the metal layer comprises copper.

4. The method of claim 3, further comprising:
depositing a barrier layer between the metal seed layer and the dielectric layer prior to depositing the metal seed layer.

5. The method of claim 1, wherein converting the uppermost portion of the metal seed precursor comprises:

exposing the metal seed precursor to an ambient environment at room temperature.

6. The method of claim 5, wherein the ambient environment comprises a nitrogen ($N_2$) or an oxygen ($O_2$) gas.

7. The method of claim 5, wherein the capping layer has a thickness of less than approximately 10 Å.

8. The method of claim 5, wherein plating the metal layer comprises immersing the integrated circuit device in the plating bath that dissolves the capping layer without forming discontinuities in the metal seed layer.

9. The method of claim 1, wherein plating the metal layer comprises placing the integrated circuit device in an acidic chemical bath having a pH level in a range of approximately 0 and approximately 7.

10. The method of claim 1, wherein the metal seed layer is deposited to a thickness in a range of approximately 20 Å to approximately 100 Å.

11. The method of claim 1, wherein the metal seed layer comprises nickel (Ni), aluminum (Al), zirconium (Zn), or platinum (Pt).

12. A method of manufacturing an integrated circuit device, comprising:
    forming a dielectric layer over a semiconductor substrate, wherein the dielectric layer has an opening extending from an upper surface of the dielectric layer to a location within the dielectric layer;
    depositing a cobalt seed precursor on surfaces of the opening using a chemical vapor deposition (CVD) process;
    exposing the cobalt seed precursor to an ambient environment to convert an uppermost portion of the cobalt seed precursor to a cobalt hydroxide layer as a capping layer;
    using the cobalt hydroxide layer to protect a lower portion of the cobalt seed precursor from oxidation as a cobalt seed layer; and
    using a plating bath to remove the cobalt hydroxide layer and plate a cobalt layer on the cobalt seed layer using an electro-chemical plating process to fill the opening.

13. The method of claim 12, wherein the cobalt seed layer is deposited to abut the dielectric layer.

14. The method of claim 12, wherein the cobalt seed layer is formed to a thickness in a range of approximately 50 Å to approximately 100 Å.

15. The method of claim 12, wherein the cobalt hydroxide layer is formed at room temperature.

16. The method of claim 15, wherein a chemical bath used by the plating process dissolves the cobalt hydroxide layer.

17. A method of manufacturing an integrated circuit device, comprising:
    forming an opening in an upper surface of a dielectric layer over a substrate;
    forming a cobalt seed precursor on surfaces of the opening;
    forming a passivation film using an uppermost portion of the cobalt seed precursor, wherein the passivation film protects a remaining portion of the cobalt seed precursor from oxidation; and
    immersing the integrated circuit device in a plating bath that dissolves the passivation film and forms a cobalt layer on the remaining portion of the cobalt seed precursor using an electro-chemical plating process to fill the opening.

18. The method of claim 17, wherein the cobalt seed precursor is deposited to abut the dielectric layer.

19. The method of claim 17, wherein the passivation film is formed by exposing the cobalt seed precursor to an ambient environment at room temperature.

20. The method of claim 17, wherein the passivated film is deposited to a thickness of less than approximately 10 Å.

* * * * *